United States Patent
Tao et al.

(10) Patent No.: US 10,855,264 B1
(45) Date of Patent: Dec. 1, 2020

(54) CIRCUIT FOR GENERATING DIFFERENTIAL REFERENCE VOLTAGES, CIRCUIT FOR DETECTING SIGNAL PEAK, AND ELECTRONIC DEVICE

(71) Applicant: LONTIUM SEMICONDUCTOR CORPORATION, Anhui (CN)

(72) Inventors: Cheng Tao, Anhui (CN); Xiangyu Ji, Anhui (CN); Yu Chen, Anhui (CN); Jiaxi Fu, Anhui (CN); Haiyan Wei, Anhui (CN)

(73) Assignee: LONTIUM SEMICONDUCTOR CORPORATION, Anhui (CN)

( * ) Notice: Subject to any disclaimer, the term of this patent is extended or adjusted under 35 U.S.C. 154(b) by 0 days.

(21) Appl. No.: 16/730,132

(22) Filed: Dec. 30, 2019

(30) Foreign Application Priority Data

Nov. 1, 2019 (CN) .......................... 2019 1 1059282

(51) Int. Cl.
*H03K 5/153* (2006.01)
*H03K 5/1532* (2006.01)
*H03F 3/45* (2006.01)

(52) U.S. Cl.
CPC ....... *H03K 5/1532* (2013.01); *H03F 3/45179* (2013.01); *H03F 2203/45022* (2013.01); *H03F 2203/45156* (2013.01)

(58) Field of Classification Search
CPC ...... H03K 5/1532; H03K 5/24; H03K 5/2481; H03K 5/249; G01R 19/04; G01R 19/0038;
(Continued)

(56) References Cited

U.S. PATENT DOCUMENTS 5,493,214 A    2/1996 Good et al.
6,424,218 B1   7/2002 Barber et al.
(Continued)

FOREIGN PATENT DOCUMENTS

CN    1965237 A    5/2007
CN    105577163 A   5/2016
(Continued)

OTHER PUBLICATIONS

Taiwanese First Office Action for corresponding TW Application No. 108147902, dated Jul. 28, 2020.

*Primary Examiner* — Long Nguyen
(74) *Attorney, Agent, or Firm* — Cantor Colburn LLP

(57) ABSTRACT

A circuit for generating differential reference voltages, a circuit for detecting a signal peak, and an electronic device. In the circuit for generating reference voltages, a common-mode extraction circuit receives a first differential signal and a second differential signal, extracts a common-mode level from the first differential signal and the second differential signal, and applies the common-mode level to a non-inverting input terminal of a first operational amplifier. The first operational amplifier, a main control switch, a first voltage dividing resistor, a second voltage dividing resistor, and a first direct current power source constitute a feedback loop, to generate differential reference voltages matching with the common-mode level. Adjusting a current provided by the first direct current power source can change the differential reference voltages, obtaining a reference for to-be-detected amplitude of the signals. Signal amplitude is detected with high precision, and detection reliability of a peak detecting circuit is improved.

10 Claims, 7 Drawing Sheets

(58) Field of Classification Search
CPC ... G11C 27/00; G11C 27/026; H03F 3/45071; H03F 3/45179; H03F 3/45183; H03F 1/34; H03F 2203/45022; H03F 2203/45156
See application file for complete search history.

(56) References Cited

U.S. PATENT DOCUMENTS

| | | | |
|---|---|---|---|
| 7,639,059 B1 * | 12/2009 | Yu | H03K 19/018585 |
| | | | 327/108 |
| 8,390,264 B2 * | 3/2013 | Lin | H03M 1/0845 |
| | | | 323/281 |
| 2005/0218958 A1 | 10/2005 | Ajram et al. | |
| 2015/0171803 A1 | 6/2015 | Pai | |
| 2016/0126724 A1 | 5/2016 | Yun et al. | |

FOREIGN PATENT DOCUMENTS

| | | |
|---|---|---|
| CN | 16730132 A | 12/2019 |
| TW | 201526533 A | 7/2020 |

* cited by examiner

CIRCUIT FOR GENERATING DIFFERENTIAL REFERENCE VOLTAGES, CIRCUIT FOR DETECTING SIGNAL PEAK, AND ELECTRONIC DEVICE

CROSS-REFERENCE TO RELATED APPLICATIONS

The present invention claims priority under 35 U.S.C. § 119 to Chinese Patent Application No. 201911059282.1, filed on Nov. 1, 2019, the entire contents of which are incorporated herein by reference.

FIELD

The present disclosure relates to the technical field of integrated circuits, and in particular to, a circuit for generating differential reference voltages, a circuit for detecting a signal peak, and an electronic device, which achieve high precision and high linearity.

BACKGROUND

In a communication system, it is often necessary to determine amplitude of a received signal in both wireless communication and wired communication. An operation mode of the system or a parameter of an automatic control system is changed based on the amplitude of the received signal. The mode or the automatic control operation may include, but are not limited to, following cases.

(1) In a case that amplitude of an inputted signal is lower than a certain value, the system enters a sleep mode or a standby mode, to reduce power consumption.

(2) In a case that amplitude of an inputted signal is higher than a certain value, the system changes from a sleep mode or a standby mode into a normal operation mode.

(3) In a case that amplitude of an inputted signal is lower than a certain value, amplitude of a signal from a transmitter is increased, to ensure proper transmission amplitude of the transmitted signal.

(4) In a case that amplitude of an inputted signal is higher than a certain value, amplitude of a signal from a transmitter is reduced, to avoid electro-magnetic radiation and electro-magnetic interference (EMI) due to excessive swing of the signal.

(5) In USB3.x, it is distinguished whether current transmission is of a low frequency period signal (LFPS), of a super-speed signal (SS), or in an idling state (IDLE); and (6) In an analog adaptive equalizer, high-frequency and low-frequency parts are separated from a signal spectrum and compared in energy via a high-pass filter (HPF) and a low-pass filter (LPF), to calculate an optimal parameter of the equalizer automatically.

Amplitude of a received signal is usually detected via a peak detecting circuit. Accuracy and linearity of the peak detecting circuit determines a subsequent operation of the system or accuracy of a control result. Therefore, the peak detecting circuit is an important part of a high-performance intelligent communication system.

A conventional peak detecting mechanism is subject to a large detection error in case of small signal amplitude, resulting in inadequate accuracy and linearity in detection, and failing to meet requirements on high accuracy of a device. Therefore, it is an urgent issue for those skilled in the art how to improve reliability of a detection result of a peak detecting circuit.

SUMMARY

Therefore, a circuit for generating differential reference voltages, a circuit for detecting a signal peak, and an electronic device, are provided according to embodiments of the present disclosure, so as to improve reliability of a detection result of a peak detecting circuit.

To achieve the above objective, following technical solutions are provided according to embodiments of the present disclosure.

A circuit for generating differential reference voltages is provided, which includes a common-mode extraction circuit, a first operational amplifier, a main control switch, a first voltage dividing resistor, a second voltage dividing resistor, and a first direct current power source.

A first input terminal of the common-mode extraction circuit is configured to receive a first differential signal, a second input terminal of the common-mode extraction circuit is configured to receive a second differential signal, and an output terminal of the common-mode extraction circuit serves as a first output terminal of the circuit for generating differential reference voltages.

A non-inverting input terminal of the first operational amplifier is connected to the output terminal of the common-mode extraction circuit.

A control terminal of the main control switch is connected to an output terminal of the first operational amplifier, and an input terminal of the main control switch is connected to a first power source.

A first terminal of the first voltage dividing resistor is connected to an output terminal of the main control switch, and a second terminal of the first voltage dividing resistor is connected to an inverting input terminal of the first operational amplifier. The first terminal of the first voltage dividing resistor serves as a second output terminal of the circuit for generating differential reference voltages. The second terminal of the first voltage dividing resistor serves as a third output terminal of the circuit for generating differential reference voltages.

A first terminal of the second voltage dividing resistor is connected to the second terminal of the first voltage dividing resistor, a second terminal of the second voltage dividing resistor is connected to a first terminal of the first direct current power source. A second terminal of the first direct current power source is grounded. A current supplied by the first direct current power source is adjustable. The second terminal of the second voltage dividing resistor serves as a fourth output terminal of the circuit for generating differential reference voltages.

In an embodiment, the common-mode extraction circuit includes a first common-mode extraction resistor and a second common-mode extraction resistor.

A first terminal of the first common-mode extraction resistor serves as the first input terminal of the common-mode extraction circuit.

A first terminal of the second common-mode extraction resistor is connected to a second terminal of the first common-mode extraction resistor at a common node. A second terminal of the second common-mode extraction resistor serves as the second input terminal of the common-mode extraction circuit. The common node serves as the output terminal of the common-mode extraction circuit.

In an embodiment, the main control switch is a PMOS (p-channel metal-oxide-semiconductor)transistor.

A circuit for detecting a signal peak is provided, including any of the aforementioned circuits for generating differential reference voltages.

In an embodiment, in the above, an amplification-rectification circuit of the circuit for detecting the signal peak includes a second direct current power source, a first switch transistor, a second switch transistor, a third switch transistor, a fourth switch transistor, a fifth switch transistor, a sixth switch transistor, and a first capacitor.

A second terminal of the second direct current power source is grounded.

The first switch transistor, the second switch transistor, and the third switch transistor are connected in parallel. A first common terminal of the first switch transistor, the second switch transistor, and the third switch transistor is connected to a first terminal of the second direct current power source. A second common terminal of the first switch transistor, the second switch transistor, and the third switch transistor is connected to a second power source.

The fourth switch transistor, the fifth switch transistor, and the sixth switch transistor are connected in parallel. A first common terminal of the fourth switch transistor, the fifth switch transistor, and the sixth switch transistor is connected to the first terminal of the second direct current power source. A second common terminal of the fourth switch transistor, the fifth switch transistor, and the sixth switch transistor is connected to the second power source.

A first terminal of the first capacitor is connected to the second common terminal of the first switch transistor, the second switch transistor, and the third switch transistor. A second terminal of the first capacitor is connected to the second common terminal of the fourth switch transistor, the fifth switch transistor and the sixth switch transistor. The first terminal of the first capacitor serves as a first output terminal of the amplification-rectification circuit. The second terminal of the first capacitor serves as a second output terminal of the amplification-rectification circuit.

A control terminal of the first switch transistor is configured to receive the first differential signal.

A control terminal of the second switch transistor is configured to receive the second differential signal.

A control terminal of the third switch transistor is connected to the third output terminal of the circuit for generating differential reference voltages.

A control terminal of the fourth switch transistor is connected to the first output terminal of the circuit for generating differential reference voltages.

A control terminal of the fifth switch transistor is connected to the fourth output terminal of the circuit for generating differential reference voltages.

A control terminal of the sixth switch transistor is connected to the second output terminal of the circuit for generating differential reference voltages.

In an embodiment, the third switch transistor includes a first sub-switch transistor and a second sub-switch transistor that are connected in parallel. The first sub-switch transistor and the second sub-switch transistor are identical in specifications. The fourth switch transistor comprises a third sub-switch transistor and a fourth sub-switch transistor that are connected in parallel. The third sub-switch transistor and the fourth sub-switch transistor are identical in specifications.

In an embodiment, the circuit for detecting the signal peak further includes a filter circuit.

The filter circuit is arranged between the second power source and the amplification-rectification circuit. The filter circuit includes the first capacitor, a first filter resistor, and a second filter resistor.

A first terminal of the first filter resistor is connected to the second power source, and a second terminal of the first filter resistor is connected to the second common terminal of the first switch transistor, the second switch transistor, and the third switch transistor.

A first terminal of the second filter resistor is connected to the second power source, and a second terminal of the second filter resistor is connected to the second common terminal of the fourth transistor, the fifth switch transistor, and the sixth switch transistor.

In an embodiment, the circuit for detecting a signal peak further includes a comparator. A non-inverting input terminal of the comparator is connected to the first output terminal of the amplification-rectification circuit, and an inverting input terminal of the comparator is connected to the second output terminal of the amplification-rectification circuit.

In an embodiment, each of the first switch transistor, the second switch transistor, the third switch transistor, the fourth switch transistor, the fifth switch transistor, and the sixth switch transistor is an NMOS (n-channel metal-oxide-semiconductor) transistor.

An electronic device is provided, including any of the aforementioned the circuits for detecting the signal peak.

In the above technical solutions, the common-mode extraction circuit receives the first differential signal and the second differential signal, extracts a common-mode level from the first differential signal and the second differential signal, and applies the common-mode level to the non-inverting input terminal of the first operational amplifier. The first operational amplifier, the main control switch, the first voltage dividing resistor, the second voltage dividing resistor, and the first direct current power source constitute a feedback loop, to generate differential reference voltages that match with the common-mode level. By adjusting a current provided by the first direct current power source, the differential reference voltages can be changed, and a reference for to-be-detected amplitude of a signal can be obtained. Therefore, amplitude of the signal is detected with high precision in the technical solutions, providing a circuit basis for improving reliability of a detection result of a peak detecting circuit.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques.

Apparently, the drawings in the following descriptions are only some embodiments of the present disclosure, and other drawings may be obtained by those skilled in the art based on the provided drawings without creative efforts.

DETAILED DESCRIPTION OF THE EMBODIMENTS

Hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

Figure 1:
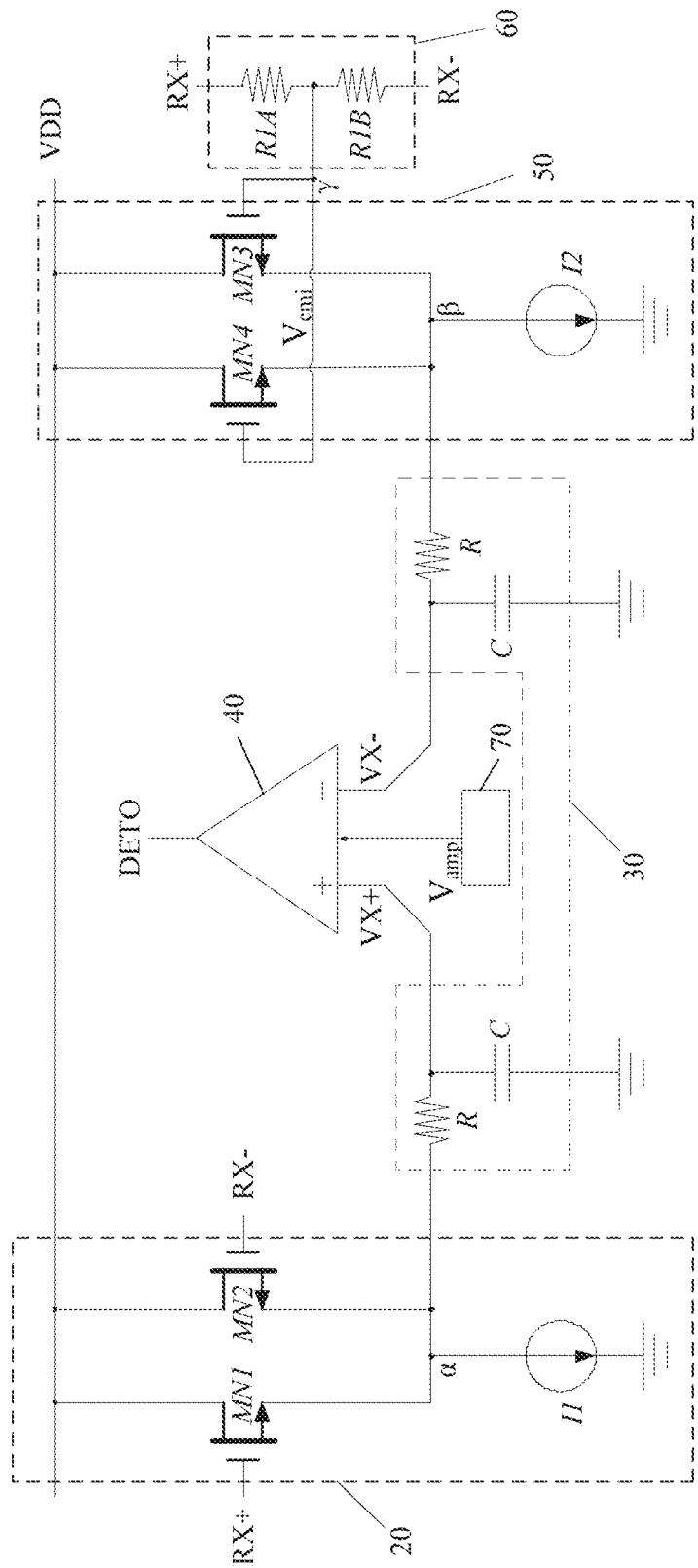
FIG. 1 is a schematic structural diagram of a circuit for implementing signal amplitude detection.
Figure 2:
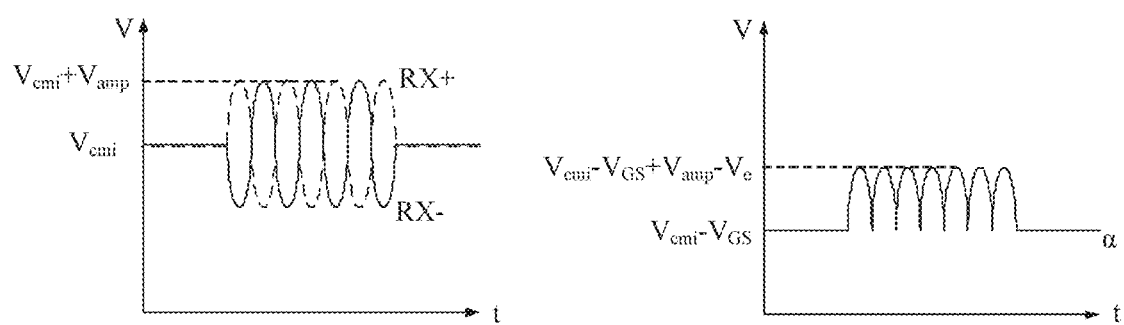
FIG. 2 is a schematic diagram of waveforms of signals of the circuit shown in FIG. 1.
Figure 3:
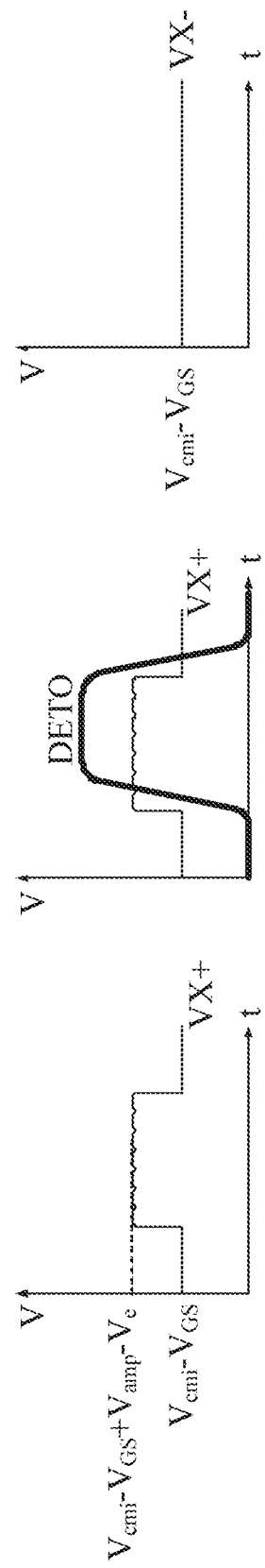
FIG. 3 is a schematic diagram of waveforms of other signals of the circuit shown in FIG. 1.
Figure 4:
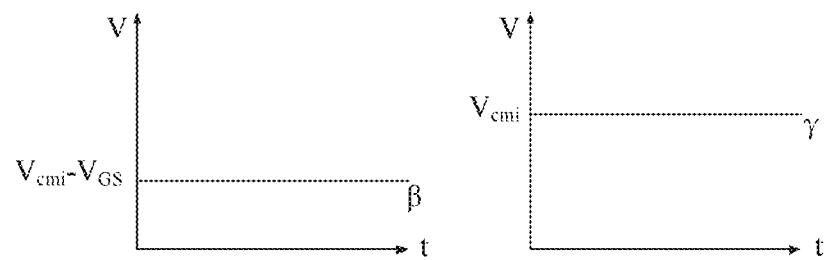
FIG. 4 is a schematic diagram of waveforms of other signals of the circuit shown in FIG. 1.

Reference is made to FIG. 1, which is a circuit for implementing signal amplitude detection. The circuit includes a full-wave rectification circuit 20, a low-pass filter 30, a comparator 40, a common-mode input follower 50, a common-mode extraction circuit 60, and a comparator-threshold adjustment module 70. In FIG. 1, I1 and I2 indicate bias currents of the full-wave rectification circuit 20 and the common-mode input follower 50, respectively. Differential input signals RX+ and RX− fluctuate symmetrically with respect to a common-mode level $V_{cmi}$, and fluctuation amplitude $V_{amp}$ is a signal swing. After the differential input signals RX+ and RX− pass the full-wave rectification circuit 20, a part of the signals that is below the common-mode level is flattened. The differential signals RX+ and RX− turn into a half-wave signal, and the common-mode level is shifted down by $V_{GS}$. $V_{GS}$ represents gate-source voltages of a rectifying NMOS transistor MN1 and a rectifying NMOS transistor MN2 under the bias current I1 in the full-wave rectification circuit. The rectified signal is filtered by the low-pass filter 30 to remove high frequency components in the signal, and an approximate amplitude level VX+ of the signals is obtained. A reference level, with which the amplitude level is compared, is necessary in obtaining a detection output. The reference level can be obtained from the input signals by using a similar circuit. After received via the common-mode extraction circuit 60, the differential input signals pass the common-mode input follower 50, to obtain a reference level VX−. The comparator 40 outputs a final detection signal after comparing VX+ and VX−. The comparator-threshold adjustment module 70 is configured to set a threshold voltage $V_{amp}$, that is, a difference between inputs, at which a level of the output signal of the comparator is flipped. Waveforms of signals RX+, RX−, VX+, VX− and DETO, and signals at nodes α, β, and γ in FIG. 1 are schematically shown in FIG. 2 to FIG. 4. It is appreciated that the threshold voltage $V_{amp}$ represents to-be-detected swing amplitude of the signals.

The circuit shown in FIG. 1 has significant disadvantages as follows. First, the to-be-detected amplitude $V_{amp}$ of the signals is set by adjusting the threshold voltage of the comparator. The threshold voltage is influenced by factors such as process variations and mismatches of the comparator, and thereby varies within a great range, resulting in low comparison accuracy and linearity. Second, rectification is implemented by a voltage follower. A gain of the voltage follower is less than 1, resulting in that the signals are reduced in amplitude after passing by the rectification circuit. Therefore, an error $V_e$ is generated in signal amplitude detection, that is, actual signal amplitude after rectification should be equal to $V_{amp}-V_e$.

Figure 5:
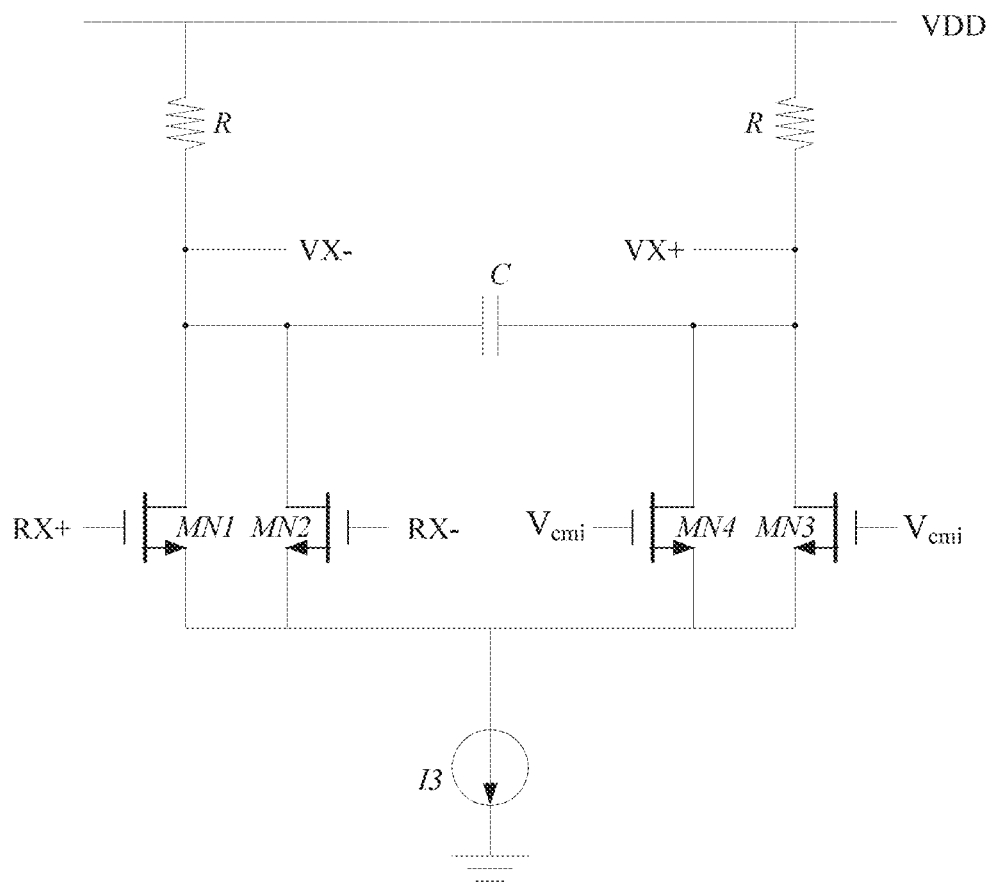
FIG. 5 is a schematic structural diagram of another circuit for implementing signal amplitude detection.

Reference is made to FIG. 5, which shows another conventional circuit for detecting signal amplitude. Such circuit addresses the issue of the circuit as shown in FIG. 1, where the error is generated by the rectification circuit due to reduction of the signal amplitude. In FIG. 5, a switching transistor MN1, a switching transistor MN2, a direct current power source 13, and a resistor R constitute a common source amplifier. The resistor R and a capacitor C constitute a low-pass filter. The switch transistor MN1 and the switch transistor MN2 further serve as a rectification stage. Since an output of rectification is at a drain instead of a source of the switch transistors, the signal amplitude is amplified rather than being reduced. An amplification factor is determined based on a transconductance $g_m$ of the switching transistor and the load resistance R.

Accordingly, an issue of how to improve reliability of a detection result of a peak detecting circuit is converted into an issue of how to provide accurate and reliable to-be-detected amplitude $V_{amp}$ of the signals to a comparator in a circuit for detecting a signal peak.

Figure 6:
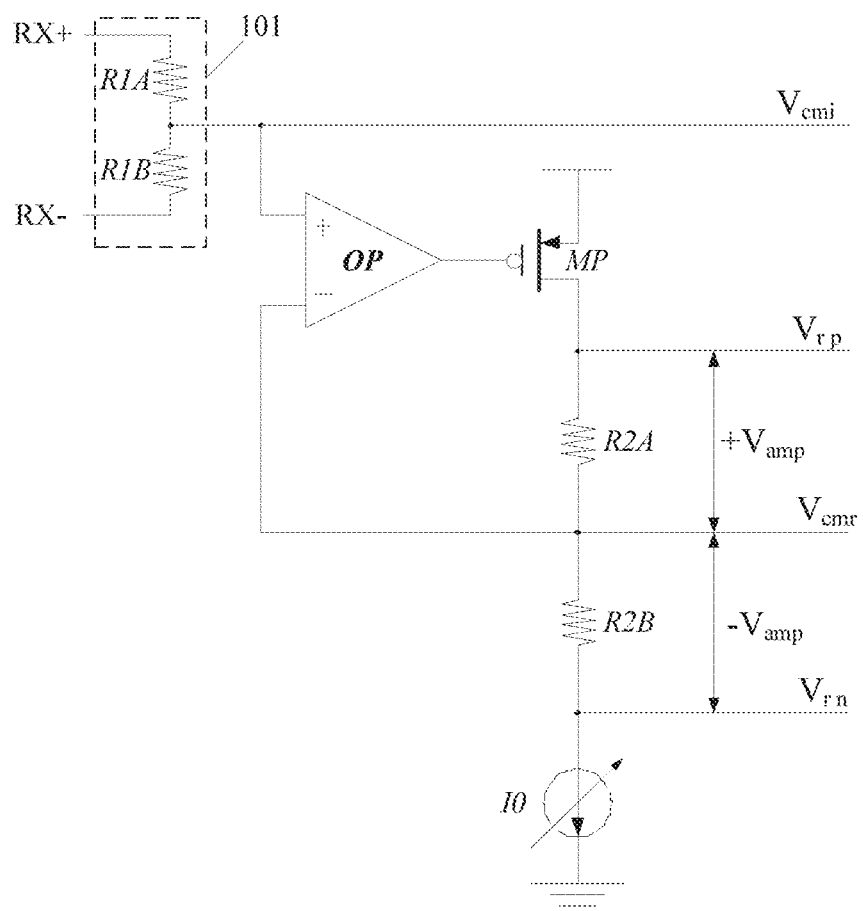
FIG. 6 is a schematic structural diagram of a circuit for generating differential reference voltages according to an embodiment of the present disclosure.

In order to address the above issue, a circuit for generating differential reference voltages is provided according to an embodiment of the present disclosure. Referring to FIG. 6, the circuit may include: a common-mode extraction circuit 101, a first operational amplifier OP, a main control switch MP, a first voltage dividing resistor R2A, a second voltage dividing resistor R2B, and a first direct current power source I0. A connection relationship among the above electronic components is also shown in FIG. 6.

A first input terminal of the common-mode extraction circuit 101 is configured to receive a first differential signal RX+. A second input terminal of the common-mode extraction circuit 101 is configured to receive a second differential signal RX−. An output terminal of the common-mode extraction circuit 101 serves as a first output terminal of the circuit for generating differential reference voltages, and outputs a common-mode level $V_{cmi}$.

A non-inverting input terminal of the first operational amplifier OP is connected to the output terminal of the common-mode extraction circuit 101. An inverting input terminal of the first operational amplifier OP is connected to a second terminal of the first voltage dividing resistor R2A. An output terminal of the first operational amplifier OP is connected to a control terminal of the main control switch MP.

The control terminal of the main control switch MP is connected to the output terminal of the first operational amplifier OP. An input terminal of the main control switch MP is connected to a first power source (a voltage source). The first power source is configured to supply a current. An output terminal of the main control switch MP is connected to a first terminal of the first voltage dividing resistor R2A.

The first terminal of the first voltage dividing resistor R2A is connected to the output terminal of the main control switch MP. The second terminal of the first voltage dividing resistor R2A is connected to the inverting input terminal of the first operational amplifier OP. The first terminal of the first voltage dividing resistor R2A serves as a second output terminal of the circuit for generating differential reference voltages, and is configured to provide a signal $V_{rp}$. The second terminal of the first voltage dividing resistor R2A serves as a third output terminal the circuit for generating differential reference voltages, and is configured to provide a signal $V_{cmr}$.

A first terminal of the second voltage dividing resistor R2B is connected to the second terminal of the first voltage dividing resistor R2A. A second terminal of the second voltage dividing resistor R2B is connected to a first terminal of the first direct current power source I0. A second terminal of the first direct current power source I0 is grounded. A current supplied by the first direct current power source I0 is adjustable. The first direct current power source I0 may be regarded as a current adjustment circuit, which is configured to adjust a current flowing through the main control switch MP, the first voltage dividing resistor R2A, and the second voltage dividing resistor R2B. The second terminal of the second voltage dividing resistor R2B serves as a fourth output terminal of the circuit for generating differential reference voltages, and is configured to provide a signal V. In an embodiment, a resistance of the first voltage dividing resistor R2A is equal to a resistance of the second voltage dividing resistor R2B.

In the circuit for generating differential reference voltages according to this embodiment, the common-mode extraction circuit 101 receives the differential signal RX+ and the differential signal RX− via, extracts a common-mode level $V_{cmi}$ from the differential signal RX+ and the differential signal RX−, and applies the common-mode level $V_{cmi}$ to the non-inverting input terminal of the first operational amplifier OP. The first operational amplifier OP, the main control switch MP, the first voltage dividing resistor R2A, the second voltage dividing resistor R2B, and the first direct current power source I0 constitute a feedback loop to generate differential reference voltages $V_{rp}$, $V_m$, and $V_{cmr}$ that match with the common-mode level $V_{cmi}$. In order to distinguish the above three voltages. $V_{rp}$ is denoted as a first differential reference voltage, $V_m$ is denoted as a second differential reference voltage, and $V_{cmr}$ is denoted as a third differential reference voltage. The first differential reference voltage $V_{rp}$ represents a reference voltage for a positive swing of the differential signals, the second differential reference voltage $V_m$ represents a reference voltage for a negative swing of the differential signals, and the third differential reference voltage $V_{cmr}$ is equal to the common-mode level $V_{cmi}$. Signals provided by the circuit for generating differential reference voltages have following relationships.

$$V_{cmr}=V_{cmi}.$$

$$V_{amp}=I0*R2A=I0*R2B.$$

I0 represents the current flowing through the first voltage dividing resistor R2A and the second voltage dividing resistor R2B.

$$V_{rp}=V_{cmr}+V_{amp}=V_{cmi}+I0*R2A.$$

$$V_m=V_{cmr}-V_{amp}=V_{cmi}-I0*R2B.$$

From the above equations, it can be seen that the reference $V_{am}$ may be accurately calculated based on the resistance of the first voltage dividing resistor R2A and the second voltage dividing resistor R2B, and the current I0. $V_{amp}$, $V_{rp}$ and $V_m$ can be changed by adjusting the current I0 via the first direct current power source I0. Thereby, the reference $V_{amp}$ for the to-be-detected amplitude of the signals can be obtained. Therefore, amplitude of a signal is detected with high precision according to this embodiment.

In an embodiment, a structure of the common-mode extraction circuit 101 may be configured on requirement. Reference is made to FIG. 6 as an example. The common-mode extraction circuit 101 may include a first common-mode decimation resistor R1A and a second common-mode decimation resistor R1B. The common-mode level $V_{cmi}$ of differential signals RX+ and RX− can be extracted by the first common-mode extraction resistor R1A and the second common-mode extraction resistor R1B through following configuration.

A first terminal of the first common-mode extraction resistor R1A serves as the first input terminal of the common-mode extraction circuit 101.

A first terminal of the second common-mode extraction resistor R1B is connected to a second terminal of the first common-mode extraction resistor R1A at a common node. A second terminal of the second common-mode extraction resistor R1B serves as the second input terminal of the common-mode extraction circuit 101. The common node between the first common-mode extraction resistor R1A and the second common-mode extraction resistor R1B serves as the output terminal of the common-mode extraction circuit 101.

In an embodiment, a type of the main control switch MP may be selected on requirement. For example, the main control switch MP may be a PMOS transistor.

Corresponding to the aforementioned circuit for generating differential reference voltages, a circuit for detecting a signal peak is further provided according to an embodiment of the present disclosure. The circuit for detecting the signal peak may apply any of the aforementioned circuits for generating differential reference voltages as a source of one or more differential reference voltages. The one or more differential reference voltages may include, but is not limited to, $V_{rp}$, $V_m$, $V_{cmr}$ and/or $V_{amp}$. In an embodiment, the one or more differential reference voltages are directly applied to the technical solution as shown in FIG. 1, to provide the threshold voltage $V_{amp}$ for the comparator 40.

In another embodiment of the present disclosure, an amplification circuit in the circuit for detecting a signal peak is further improved. An amplification-rectification circuit matched with the circuit for generating differential reference voltages is provided, which can both amplify and rectify a signal.

Figure 7:
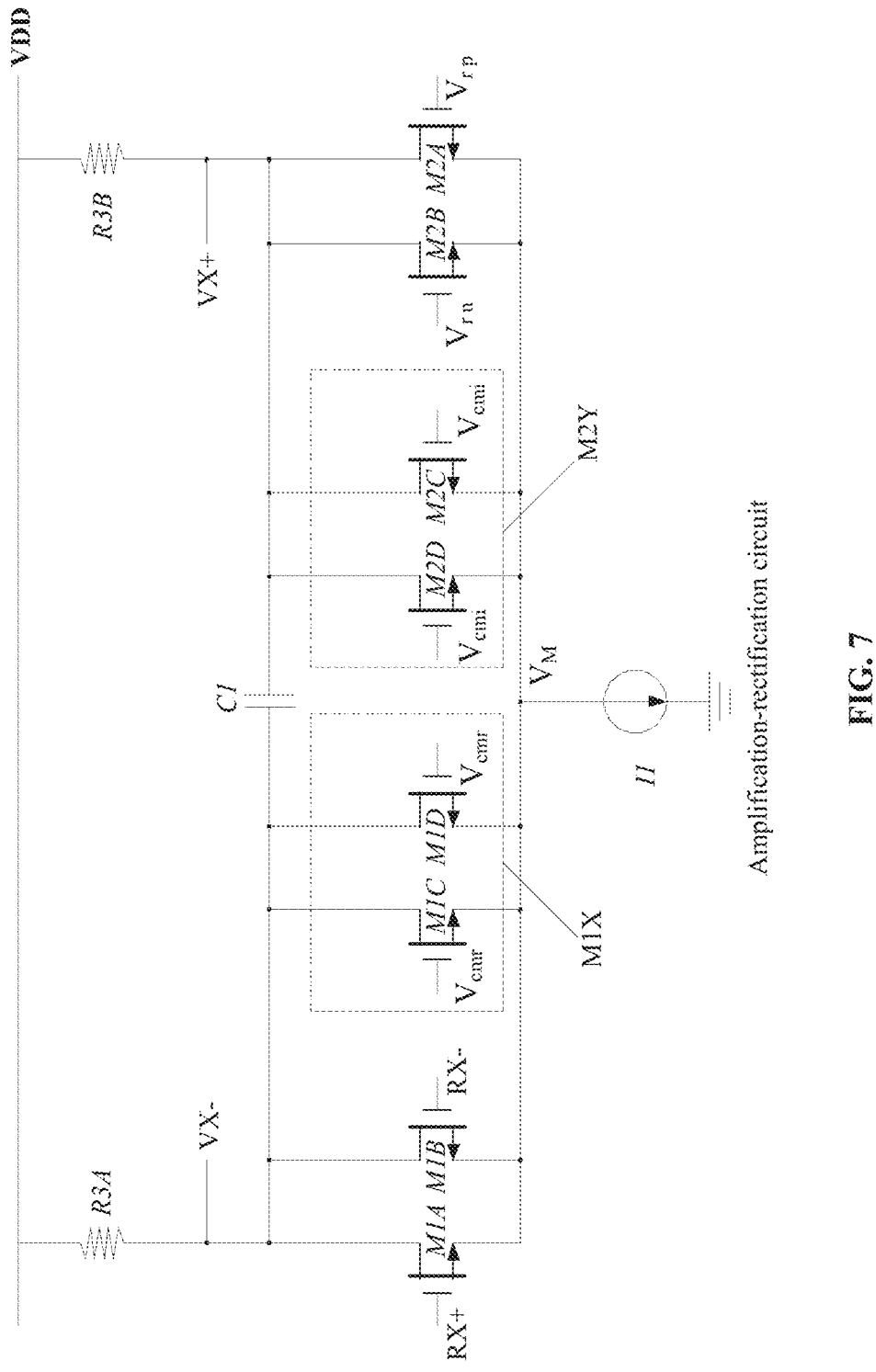
FIG. 7 is a schematic structural diagram of an amplification-rectification circuit according to an embodiment of the present disclosure.

Referring to FIG. 7, the amplification-rectification circuit may include: a second direct current power source I1, a first switch transistor M1A, a second switch transistor M1B, a third switch transistor M1X, a fourth switch transistor M2Y, a fifth switch transistor M2B, a sixth switch transistor M2A, and a first capacitor C1. The first switch transistor M1A, the second switch transistor M1B, and the third switch transistor M1X are connected in parallel. The fourth switch transistor M2Y, the fifth switch transistor M2B, and the sixth switch transistor M2A are connected in parallel.

A first terminal of the second direct current power source I1 is connected to a first common terminal of the first switch transistor M1A, the second switch transistor M1B, and the third switch transistor M1X, and further connected to a first common terminal of the fourth switch transistor M2Y, the fifth switch transistor M2B, and the sixth switch transistor M2A. A second terminal of the second direct current power source I1 is grounded.

The first common terminal of the first switch transistor M1A, the second switch transistor MB, and the third switch transistor M1X is connected to the first terminal of the second direct current power source I1. A second common terminal of the first switch transistor M1A, the second switch transistor M1B, and the third switch transistor M1X is connected to a second power source VDD. The second power source is a voltage source.

The first common terminal of the fourth switch transistor M2Y, the fifth switch transistor M2B, and the sixth switch transistor M2A is connected to the first terminal of the second direct current power source I1. A second common terminal of the fourth switch transistor M2Y, the fifth switch transistor M2B, and the sixth switch transistor M2A is connected to the second power source.

A first terminal of the first capacitor C1 is connected to the second common terminal of the first switch transistor M1A, the second switch transistor M1B, and the third switch transistor M1X. A second terminal of the first capacitor C1 is connected to the second common terminal of the fourth switch transistor M2Y, the fifth switch transistor M2B, and the sixth switch transistor M2A. The first terminal of the first capacitor C1 serves as a first output terminal of the amplification-rectification circuit, and is configured to provide a comparing signal VX− for a comparator in a subsequent stage. The second terminal of the first capacitor C1 serves as a second output terminal of the amplification-rectification circuit, and is configured to provide a comparing signal VX+ for the comparator in the subsequent stage.

A control terminal of the first switch transistor MIA is configured to receive the first differential signal RX+.

A control terminal of the second switch transistor M1B is configured to receive the second differential signal RX−.

A control terminal of the third switch transistor M1X is connected to the third output terminal of the circuit for generating differential reference voltages.

A control terminal of the fourth switch transistor M2Y is connected to the first output terminal of the circuit for generating differential reference voltages.

A control terminal of the fifth switch transistor M2B is connected to the fourth output terminal of the circuit for generating differential reference voltages.

A control terminal of the sixth switch transistor M2A is connected to the second output terminal of the circuit for generating differential reference voltages.

A direct current balancing technique is used in the amplification-rectification circuit according to this embodiment. A comparison error due to a mismatch between the common-mode level $V_{cmi}$ extracted from the differential signals and the reference common-mode level $V_{cmr}$ outputted by the feedback loop is eliminated. In a case that the third switching transistor M1X and the fourth switching transistor M2Y are not considered, the structure of the amplification-rectification circuit is identical to the structure of the circuit as shown in FIG. 5, except that the differential signal common-mode level $V_{cmi}$ in the circuit as shown in FIG. 5 is replaced by $V_{rp}$ and $V_m$. It is the differential signal swing and the differential reference voltages $V_{rp}$ and $V_m$ that are used in comparison. However, there is an error between $V_{cmr}$ and $V_{cmi}$, and thereby $V_{cmr}=V_{cmi}+V_{os}$, where $V_{os}$ represents a voltage offset caused by any possible factor. The possible factors may include but are not limited to a finite gain of the operational amplifier, a mismatch between devices, a process variation, or the like. In order to eliminate the voltage offset and improve the detection accuracy, the third switch transistor M1X and the fourth switch transistor M2Y are introduced according to this embodiment of the present disclosure. The first switching transistor M1A, the second switching transistor M1B, the third switching transistor MI X, the fourth switching transistor M2Y, the fifth switching transistor M2B, and the sixth switching transistor M2A are included in the amplification-rectification circuit in this embodiment.

In the above structure, a bias current generated at the second common terminal of the first switching transistor MIA, the second switching transistor M1B, and the third switching transistor M1X, and a bias current generated at the second common terminal of the fourth switching transistor M2Y, the fifth switching transistor M2B, and the sixth switching transistor M2A are as follows.

$$IVX-=gm^*(V_{GS},1A+V_{GS},1B+2V_{GS},1X).$$

$$IVX+=gm^*(V_{GS},2A+V_{GS},2B+2V_{GS},2Y)$$

It is assumed that each of the third switch transistor M1X and the fourth switch transistor M1Y are twice each of the first switch transistor M1A, the second switch transistor M1B, the fifth switch transistor M2A, and the sixth switch transistor M2B in transconductance. In an embodiment, each of M1X and M1Y includes two sub-switch transistors that are connected in parallel. As an example shown in FIG. 7, M1X includes sub-switch transistors M1C and M1D, and M2Y includes sub-switch transistors M2C and M2D, M1A, M1B, M1C, M1D, M2C, M2D, M2A and M2B are identical in transconductance.

There are $V_{GS},1A=V_{GS},1B=V_{cmi}-VM$ and the third switch transistor M1X satisfies $V_{GS},1X=V_{cmr}-VM$.

There are $V_{GS},2A=V_{GS},2B=V_{cmr}-VM$, and the fourth switch transistor M2Y satisfies $V_{GS},2Y=V_{cmi}-VM$.

The following equations can be deduced.

$$IVX-=2^*gm^*(V_{cmi}+V_{cmr}-2VM)=4^*gm^*(V_{cmi}-VM+0.5^*Vos).$$

$$IVX+=2^*gm^*(V_{cmr}+V_{cmi}-2VM)=4^*gm^*(V_{cmi}-VM+0.5^*Vos).$$

From the above two equations, it can be seen that the bias currents flowing through two second common terminals of the switching transistors in the amplification-rectification circuit are same. Therefore, the mismatch between $V_{cmr}$ and $V_{cmi}$ is eliminated. An operation process of the amplification-rectification circuit is as follows. In a case that the the inputted differential signal RX+ and the differential signal RX− is higher (or lower) than the differential reference amplitudes $V_{rp}$ and $V_m$ in amplitude, the current flowing from I1 to the terminal VX− is greater (or less) than the current flowing from I1 to the terminal VX+. Consequently, VX+ is greater than (or less than) VX−, and an output of the comparator in the subsequent stage is immediately flipped from logic "0" (or "1") to logic "1" (or "0"). Thereby, an event of signal amplitude detection is completed.

Further, in an embodiment of the present disclosure, the circuit for detecting a signal peak may further include a filter circuit arranged between the second power source and the amplification-rectification circuit, so as to ensure stability of the signals VX− and VX+ outputted by the amplification-rectification circuit.

The filter circuit includes the first capacitor C1, a first filter resistor R3A, and a second filter resistor R3B. A first terminal of the first filter resistor R3A is connected to the second power source, and a second terminal of the first filter resistor R3A is connected to the second common terminal of the first switch transistor MIA, the second switch transistor M1B, the third switch transistor M1X. A first terminal of the second filter resistor R3B is connected to the second power source, and a second terminal of the second filter resistor R3B is connected to the second common terminal of and the fourth switch transistor M2Y, the fifth switch transistor M2B, and the sixth switch transistor M2A.

Figure 8:
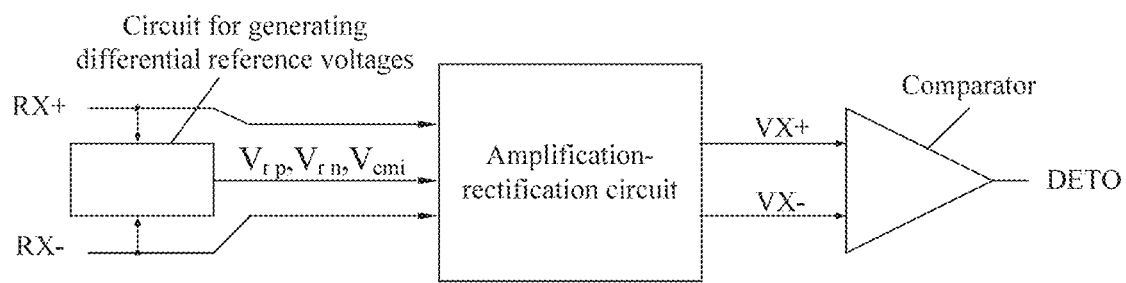
FIG. 8 is a schematic structural diagram of a circuit for detecting a signal peak according to an embodiment of the present disclosure.

Further, in an embodiment of the present disclosure, a comparator may be included in the circuit for detecting the signal peak. Referring to FIG. 8, the circuit for detecting the signal peak may further include a comparator. A non-inverting input terminal of the comparator is connected to the first output terminal of the amplification-rectification circuit, and an inverting input terminal of the comparator is connected to the second output terminal of the amplification-rectification circuit.

In an embodiment of the present disclosure, types of the first switch transistor M1A, the second switch transistor M1B, the third switch transistor M1X, the fourth switch transistor M2Y, the fifth switch transistor M2B, and the sixth switch transistor M2A may be configured on requirement. For example, each of the first switch transistor M1A, the second switch transistor M1B, the third switch transistor M1X, the fourth switch transistor M2Y, the fifth switch transistor M2B, and the sixth switch transistor M2A may be a NMOS transistor.

Based the above various embodiments, hereinafter a technical solution according to an embodiment of the present disclosure is briefly described with reference to FIG. 8.

To-be-detected amplitude of an inputted signal may be small. Thereby, in order to improve detection accuracy, the amplification-rectification circuit receives the inputted differential signals RX+ and RX−. The amplification-rectification circuit further receives the amplitude threshold signal $V_{rp}$, the amplitude threshold signal $V_m$, and the common-mode voltage $V_{cmi}$ that are generated by the circuit for generating differential reference voltages. The differential signals RX+ and RX− are compared and pre-amplified, so as to provide a sufficient resolution between the signal amplitude and the reference threshold for a subsequent circuit to process. The pre-amplified signals pass the amplification-rectification circuit, so that negative half-cycles of the pre-amplified signal are inverted. Then, the signal is filtered by a filter circuit to extract information on signal amplitude. The information on signal amplitude is sent to the comparator for comparison, so as to determine whether the swing amplitude $V_{amp}$ of the currently inputted signal reaches a differential threshold of $0.5*(V_{rp}-V_m)$. In an embodiment, a high level is outputted (i.e. DETO is logic "1") in case of $V_{amp}>0.5*(V_{rp}-V_m)$, otherwise a low level is outputted (i.e. DETO is logic "0"). The aforementioned modules are only defined from a perspective of functions, and the functions may be combined and integrated in practice.

Further, an electronic device is provided according to an embodiment of the present disclosure. The electronic device includes the circuit for detecting the signal peak according to any one of the embodiments of the present disclosure. The electronic device includes, but is not limited to, an air conditioner, a television, a mobile phone, or the like.

The embodiments of the present disclosure are described in a progressive manner, and each embodiment places emphasis on the difference from other embodiments. Therefore, one embodiment can refer to other embodiments for the same or similar parts.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A circuit for generating differential reference voltages, comprising:

a common-mode extraction circuit, wherein a first input terminal of the common-mode extraction circuit is configured to receive a first differential signal, a second input terminal of the common-mode extraction circuit is configured to receive a second differential signal, and an output terminal of the common-mode extraction circuit serves as a first output terminal of the circuit for generating differential reference voltages;

a first operational amplifier, wherein a non-inverting input terminal of the first operational amplifier is connected to the output terminal of the common-mode extraction circuit;

a main control switch, wherein a control terminal of the main control switch is connected to an output terminal of the first operational amplifier, and an input terminal of the main control switch is connected to a first power source;

a first voltage dividing resistor, wherein a first terminal of the first voltage dividing resistor is connected to an output terminal of the main control switch, and a second terminal of the first voltage dividing resistor is connected to an inverting input terminal of the first operational amplifier, the first terminal of the first voltage dividing resistor serves as a second output terminal of the circuit for generating differential reference voltages, and the second terminal of the first voltage dividing resistor serves as a third output terminal of the circuit for generating differential reference voltages;

a second voltage dividing resistor, wherein a first terminal of the second voltage dividing resistor is connected to the second terminal of the first voltage dividing resistor, and a second terminal of the second voltage dividing resistor serves a fourth output terminal of the circuit for generating differential reference voltages; and a first direct current power source, wherein a first terminal of the first direct current power source is connected to a second terminal of the second voltage dividing resistor, a second terminal of the first direct current power source is grounded, and a current supplied by the first direct current power source is adjustable.

2. The circuit for generating differential reference voltages according to claim 1, wherein the common-mode extraction circuit comprises:

a first common-mode extraction resistor, wherein a first terminal of the first common-mode extraction resistor serves as the first input terminal of the common-mode extraction circuit; and a second common-mode extraction resistor, wherein a first terminal of the second common-mode extraction resistor is connected to a second terminal of the first common-mode extraction resistor at a common node, a second terminal of the second common-mode extraction resistor serves as the second input terminal of the common-mode extraction circuit, and the common node serves as the output terminal of the common-mode extraction circuit.

3. The circuit for generating differential reference voltages according to claim 1, wherein the main control switch is a PMOS (p-channel metal-oxide-semiconductor) transistor.

4. A circuit for detecting a signal peak, comprising the circuit for generating differential reference voltages according to claim 1.

5. The circuit for detecting the signal peak according to claim 4, further comprising an amplification-rectification circuit, wherein the amplification-rectification circuit comprises:

a second direct current power source;

a first switch transistor, a second switch transistor, and a third switch transistor that are connected in parallel;

a fourth switch transistor, a fifth switch transistor, and a sixth switch transistor that are connected in parallel; and a first capacitor;

wherein a first common terminal of the first switch transistor, the second switch transistor, and the third switch transistor is connected to a first terminal of the second direct current power source, and a second common terminal of the first switch transistor, the second switch transistor and the third switch transistor is connected to a second power source;

wherein a first common terminal of the fourth switch transistor, the fifth switch transistor, and the sixth switch transistor are connected to the first terminal of the second direct current power source, and a second common terminal of the fourth switch transistor, the fifth switch transistor, and the sixth switch transistor are connected to the second power source;

wherein a second terminal of the second direct current power source is grounded;

wherein a first terminal of the first capacitor is connected to the second common terminal of the first switch transistor, the second switch transistor, and the third switch transistor, a second terminal of the first capacitor is connected to the second common terminal of the fourth switch transistor, the fifth switch transistor and the sixth switch transistor;

wherein the first terminal of the first capacitor serves as a first output terminal of the amplification-rectification circuit, and the second terminal of the first capacitor serves as a second output terminal of the amplification-rectification circuit; and wherein a control terminal of the first switch transistor is configured to receive the first differential signal, a control terminal of the second switch transistor is configured to receive the second differential signal, a control terminal of the third switch transistor is connected to the third output terminal of the circuit for generating differential reference voltages, a control terminal of the fourth switch transistor is connected to the first output terminal of the circuit for generating differential reference voltages, a control terminal of the fifth switch transistor is connected to the fourth output terminal of the circuit for generating differential reference voltages, and a control terminal of the sixth switch transistor is connected to the second output terminal of the circuit for generating differential reference voltages.

6. The circuit for detecting the signal peak according to claim 5, wherein:

the third switch transistor comprises a first sub-switch transistor and a second sub-switch transistor that are connected in parallel, wherein first sub-switch transistor and the second sub-switch transistor are identical in specifications, and the fourth switch transistor comprises a third sub-switch transistor and a fourth sub-switch transistor that are connected in parallel, wherein the third sub-switch transistor and the fourth sub-switch transistor are identical in specifications.

7. The circuit for detecting the signal peak according to claim 5, further comprising:

a filter circuit, arranged between the second power source and the amplification-rectification circuit;

wherein the filter circuit comprises the first capacitor, a first filter resistor, and a second filter resistor;

a first terminal of the first filter resistor is connected to the second power source, and a second terminal of the first filter resistor is connected to the second common terminal of the first switch transistor, the second switch transistor, and the third switch transistor; and a first terminal of the second filter resistor is connected to the second power source, and a second terminal of the second filter resistor is connected to the second common terminal of the fourth switch transistor, the fifth switch transistor, and the sixth switch transistor.

8. The circuit for detecting the signal peak according to claim 5, further comprising:

a comparator, wherein a non-inverting input terminal of the comparator is connected to the first output terminal of the amplification-rectification circuit, and an inverting input terminal of the comparator is connected to the second output terminal of the amplification-rectification circuit.

9. The circuit for detecting the signal peak according to claim 5, wherein:

each of the first switch transistor, the second switch transistor, the third switch transistor, the fourth switch transistor, the fifth switch transistor, and the sixth switch transistor is an NMOS (n-channel metal-oxide-semiconductor) transistor.

10. An electronic device, comprising the circuit for detecting the signal peak according to claim 4.

* * * * *